(12) United States Patent
Liang et al.

(10) Patent No.: US 12,286,577 B2
(45) Date of Patent: Apr. 29, 2025

(54) METHOD FOR PREPARING LIQUID CRYSTAL POLYMER FILM, LIQUID CRYSTAL POLYMER FILM AND APPLICATION THEREOF

(71) Applicant: JIANGMEN DEZHONGTAI ENGINEERING PLASTICS TECHNOLOGY CO., LTD., Jiangmen (CN)

(72) Inventors: Yonghua Liang, Jiangmen (CN); Liangwen Jin, Jiangmen (CN); Hongzhuan Zheng, Jiangmen (CN)

(73) Assignee: JIANGMEN DEZHONGTAI ENGINEERING PLASTICS TECHNOLOGY CO., LTD. (CN)

( * ) Notice: Subject to any disclaimer, the term of this patent is extended or adjusted under 35 U.S.C. 154(b) by 386 days.

(21) Appl. No.: 17/781,623

(22) PCT Filed: Jun. 4, 2020

(86) PCT No.: PCT/CN2020/094437
§ 371 (c)(1),
(2) Date: Jun. 1, 2022

(87) PCT Pub. No.: WO2021/120535
PCT Pub. Date: Jun. 24, 2021

(65) Prior Publication Data
US 2022/0403244 A1 Dec. 22, 2022

(30) Foreign Application Priority Data
Dec. 20, 2019 (CN) .......................... 201911322271.8

(51) Int. Cl.
| | |
|---|---|
| *B29C 67/24* | (2006.01) |
| *B29C 67/00* | (2017.01) |
| *B29C 71/00* | (2006.01) |
| *B29D 7/01* | (2006.01) |
| *C09K 19/38* | (2006.01) |
| *D01D 1/10* | (2006.01) |
| *D01D 5/08* | (2006.01) |
| *D01D 10/00* | (2006.01) |
| *D01D 10/02* | (2006.01) |
| *D03D 1/00* | (2006.01) |
| *D03D 15/283* | (2021.01) |
| *D03D 15/50* | (2021.01) |
| *D03D 23/00* | (2006.01) |
| *D06C 3/00* | (2006.01) |
| *D06C 7/00* | (2006.01) |
| *D06C 15/00* | (2006.01) |
| *H05K 1/03* | (2006.01) |
| *B29K 67/00* | (2006.01) |
| *B29K 105/00* | (2006.01) |

(52) U.S. Cl.
CPC ...... *C09K 19/3809* (2013.01); *B29C 67/0011* (2013.01); *B29D 7/01* (2013.01); *D01D 1/106* (2013.01); *D01D 5/08* (2013.01); *D03D 1/0082* (2013.01); *D03D 15/283* (2021.01); *D03D 15/50* (2021.01); *H05K 1/0313* (2013.01); *B29C 2791/006* (2013.01); *B29K 2067/04* (2013.01); *B29K 2105/0079* (2013.01); *B29K 2995/004* (2013.01); *B29K 2995/0041* (2013.01); *D10B 2331/041* (2013.01); *D10B 2505/00* (2013.01); *H05K 2201/0141* (2013.01)

(58) Field of Classification Search
CPC ..... B01D 37/00; B29C 67/0011; B29C 67/24; B29C 71/00; B29C 2791/006; B29D 7/01; B29K 2105/0079; B29K 2995/004; D01D 1/106; D01D 5/08; D01D 10/00; D01D 10/02; D03D 1/0082; D03D 15/283; D03D 15/50; D03D 23/00; D06C 3/00; D06C 7/00; D06C 15/00; H05K 2201/0141
USPC ..... 264/101, 103, 169, 210.1, 210.2, 211.12, 264/211.17, 211.2, 211.23, 234; 210/767; 26/51
See application file for complete search history.

(56) References Cited

U.S. PATENT DOCUMENTS

| | | | | |
|---|---|---|---|---|
| 4,786,348 A | * | 11/1988 | Luise ...................... | B29C 67/24 |
| | | | | 156/181 |
| 2010/0259910 A1 | * | 10/2010 | Hayashi ................. | B32B 15/14 |
| | | | | 361/783 |

FOREIGN PATENT DOCUMENTS

| | | |
|---|---|---|
| CN | 1252462 A | 5/2000 |
| CN | 101374388 A | 2/2009 |
| CN | 104220236 A | 12/2014 |

(Continued)

OTHER PUBLICATIONS

First Office Action for CN201911322271, dated Jan. 28, 2021.

(Continued)

*Primary Examiner* — Leo B Tentoni
(74) *Attorney, Agent, or Firm* — Billion & Armitage

(57) ABSTRACT

A method for preparing a liquid crystal polymer film, comprising: (1) spinning a liquid crystal polymer into fibers, and maintaining the fibers for 0.1 hour to 36 hours at a temperature of 200° C. to 400° C. under a vacuum degree less than 500 Pa for later use; (2) weaving the fibers prepared in step (1) into cloth for later use; and (3) pressing the cloth prepared in step (2) into a film at a temperature of 200° C. to 400° C., and then stretching the film to obtain the liquid crystal polymer film. The liquid crystal polymer film prepared by the preparation method is good in mechanical property, and has a tensile strength that can exceed 170 MPa. The prepared liquid crystal polymer film is applied to a FPC, which makes the FPC have a dielectric constant less than 3, and a small dielectric loss tangent angle.

15 Claims, No Drawings

(56) References Cited

FOREIGN PATENT DOCUMENTS

| CN | 104987564 A | 10/2015 |
|---|---|---|
| CN | 109651632 A | 4/2019 |
| CN | 110978576 A | 4/2020 |
| WO | 2010127245 A2 | 11/2010 |

OTHER PUBLICATIONS

First Search Report for CN Application No. 201911322271.8, dated Jan. 18, 2021.
International Search Report and Written Opinion for PCT/CN2020/094437 dated Sep. 4, 2020.
Second Office Action for CN201911322271 dated May 11, 2021.
Supplementary Search Report for CN Application 201911322271.8 dated Apr. 29, 2021.
Yang Shiying et al., Engineering Plastics Manual, first edition, China Textile Publishing, Aug. 31, 1994, pp. 339-347.

\* cited by examiner

METHOD FOR PREPARING LIQUID CRYSTAL POLYMER FILM, LIQUID CRYSTAL POLYMER FILM AND APPLICATION THEREOF

CROSS-REFERENCE TO RELATED APPLICATION

This application is a National Stage Application of PCT/CN2020/094437, filed on Jun. 4, 2020, which claims benefit of Application No. 201911322271.8, filed on Dec. 20, 2019 in China and which applications are incorporated herein by reference. A claim of priority to all, to the extent appropriate, is made.

TECHNICAL FIELD

The present disclosure belongs to the field of material preparation, and more particularly, relates to a method for preparing a liquid crystal polymer film and the liquid crystal polymer film prepared by the method.

BACKGROUND

Thermoplastic liquid crystal polymer (also known as LCP) refers to wholly aromatic condensation polymers with relatively rigid and linear polymer chains. When these polymers are melt, they can orient to form a liquid crystal phase. The liquid crystal polymers constitute thermoplastics with unique properties, such as wholly aromatic polyester and aramid. The wholly aromatic polyester has high heat resistance, high chemical resistance, low water absorption, high dimensional stability and low dielectric property, and has good stability in wide frequency range and temperature range.

In recent years, with the development of electronic devices to high frequency, especially the rapid development of electronic products and satellite transmission, higher requirements are put forward for the dielectric properties of electronic components. A high dielectric constant (Dk) of the electronic component will slow down a signal transmission rate, and a high dielectric loss tangent angle (Df) will make a signal be converted into heat energy partially and lost in a substrate material, so it is necessary to reduce Dk and Df. The wholly aromatic polyester is an ideal insulating material for circuit substrates due to its excellent dielectric properties.

There are two main methods to prepare films by using the wholly aromatic polyester: Method 1, tape casting, film blowing, calendering, and the like, which are standard in the film making industry, are used; Method 2, a coating method with polyimide (PI) for film making is used. However, Method 1 needs special processes and devices, with harsh preparation conditions, high production cost, high defective rate, low strength of materials and high anisotropy. Method 2 needs liquid crystal polyester with special structure. Generally, amide groups are introduced into the liquid crystal polyester to increase the polarity and solubility of the material, so that the material can be dissolved in common solvents. However, due to the introduction of the amide groups, the water absorption of the material increases, the high-frequency dielectric properties of the material decrease, and the stability of the high-frequency dielectric properties decreases. In addition, a large amount of organic solvents is needed in Method 2, so it is easy to produce pollution, and the energy consumption in the preparation process of Method 2 is high, and the mechanical strength of the prepared film is very poor.

Therefore, it is expected to provide a novel method for preparing a liquid crystal polymer film, whose preparation process is low in cost and low in energy consumption, and the prepared film has good mechanical properties and low dielectric parameters.

SUMMARY

The present disclosure aims to solve at least one of the above technical problems in the prior art. Therefore, the present disclosure provides a method for preparing a liquid crystal polymer film, and the liquid crystal polymer film prepared by the method of the present disclosure is good in mechanical property, and has a tensile strength that can exceed 170 MPa. The liquid crystal polymer film prepared by the method of the present disclosure is applied to a flexible printed circuit board (FPC), which makes the FPC have a dielectric constant less than 3 and a small dielectric loss tangent angle.

The present disclosure provides a method for preparing a liquid crystal polymer film, comprising the following steps of:

(1) spinning a liquid crystal polymer into fibers, and maintaining the fibers for 0.1 hour to 36 hours at a temperature of 200° C. to 400° C. under a vacuum degree less than 500 Pa for later use;

(2) weaving the fibers prepared in step (1) into cloth for later use; and (3) pressing the cloth prepared in step (2) into a film at a temperature of 200° C. to 400° C., and then stretching the film to obtain the liquid crystal polymer film.

In one or more embodiments, the liquid crystal polymer has a dielectric constant less than 3.5 and a dielectric loss tangent angle less than 0.002.

In one or more embodiments, the liquid crystal polymer has a melting point greater than 280° C.; and in one or more embodiments, the liquid crystal polymer has a melting point ranging from 300° C. to 800° C.

In one or more embodiments, the liquid crystal polymer has an intrinsic viscosity ranging from 4 dL/g to 10 dL/g; and in one or more embodiments, the liquid crystal polymer has an intrinsic viscosity ranging from 5.5 dL/g to 7 dL/g.

In one or more embodiments, in step (1), the liquid crystal polymer is spun into fibers by using a melt spinning method.

In one or more embodiments, devices used in the melt spinning method comprise a double-screw extruder, a melt pump, a filter, a spinning nozzle and a winder.

In one or more embodiments, a maximum heating temperature of the double-screw extruder can reach 400° C.; and in one or more embodiments, the maximum heating temperature of the double-screw extruder reaches 450° C., wherein the temperature in the spinning process is generally set above the melting point and below the thermal decomposition temperature of the liquid crystal polymer.

In one or more embodiments, a heating mode of electric heating or heat-conducting oil heating is used in the double-screw extruder. In one or more embodiments, indirect heating by heat-conducting oil is used in the double-screw extruder, wherein all heating components are heated by heat transfer via the heat-conducting oil, which is more beneficial to gentleness and uniformity of the heating process, so as to stabilize the solution and improve the stability and the yield of the fiber.

In one or more embodiments, an aperture (diameter) of the spinning nozzle used in the process of spinning the liquid crystal polymer into fibers by using the melt spinning method is less than 0.5 mm; in one or more embodiments, the aperture of the spinning nozzle used in the process of spinning the liquid crystal polymer into fibers by using the melt spinning method ranges from 0.1 mm to 0.5 mm; and in one or more embodiments, the aperture of the spinning nozzle used in the process of spinning the liquid crystal polymer into fibers by using the melt spinning method ranges from 0.2 mm to 0.4 mm. When the aperture of the spinning nozzle is greater than 0.5 mm, it is unfavorable to obtain the desired fiber diameter due to a low stretching ratio of the liquid crystal polymer.

In one or more embodiments, a typical but non-limiting aperture of the spinning nozzle used in the process of spinning the liquid crystal polymer into fibers by using the melt spinning method is, for example, 0.1 mm, 0.15 mm, 0.2 mm, 0.25 mm, 0.3 mm, 0.35 mm, 0.4 mm, 0.45 mm or 0.5 mm.

In one or more embodiments, a filtering mesh of the filter ranges from 60 meshes to 500 meshes; and in one or more embodiments, the filtering mesh of the filter ranges from 120 meshes to 300 meshes. When the filtering mesh of the filter is too low, such as less than 60 meshes, it is easy to lead to gel substances or impurities blocking a spinneret orifice; however, when the filtering mesh of the filter is too high, such as higher than 500 meshes, it is easy to cause the pressure in front of the filter to be too high.

In one or more embodiments, a typical but non-limiting filtering mesh of the filter in the process of spinning the liquid crystal polymer into fibers by using the melt spinning method is, for example, 60 meshes, 100 meshes, 120 meshes, 150 meshes, 160 meshes, 180 meshes, 200 meshes, 230 meshes, 240 meshes, 270 meshes, 300 meshes, 400 meshes or 500 meshes.

In one or more embodiments, the winder has a winding speed ranging from 300 m/min to 2,000 m/min; and in one or more embodiments, the winder has a winding speed ranging from 600 m/min to 1,800 m/min.

In one or more embodiments, a typical but not-limiting winding speed of the winder in the process of spinning the liquid crystal polymer into fibers by using the melt spinning method is, for example, 300 m/min, 600 m/min, 700 m/min, 800 m/min, 900 m/min, 1,000 m/min, 1,100 m/min, 1,200 m/min, 1,300 m/min, 1,400 m/min, 1,500 m/min, 1,600 m/min, 1,700 m/min, 1,800 m/min or 2,000 m/min.

In one or more embodiments, a thermal expansion coefficient of a winding drum used in the process of spinning the liquid crystal polymer into fibers by using the melt spinning method is larger than a thermal expansion coefficient of the fibers by 10% to 800%; and in one or more embodiments, the thermal expansion coefficient of the winding drum used in the process of spinning the liquid crystal polymer into fibers by using the melt spinning method is larger than the thermal expansion coefficient of the fibers by 50% to 500%. This is beneficial to the expansion of the winding drum in the heat treatment process to further stretch the fibers and further improve the strength of the fibers. When the thermal expansion coefficient of the winding drum is larger than the thermal expansion coefficient of the fibers by no more than 10%, the enhancement effect on the strength of the fibers is not obvious. When the thermal expansion coefficient of the winding drum is larger than the thermal expansion coefficient of the fibers by more than 800%, it is easy for the fibers to break in the post-treatment process.

The strength of the fibers spun by the device used in the above melt spinning method is generally low, so it is necessary to further improve the strength of the fibers by heat treatment. The heat treatment process of the present disclosure is carried out under negative pressure to heat the fibers to below its melting point and maintain this temperature for a certain time by heat transfer through the heat-conducting oil. As the temperature of the heat treatment process is always below the melting point of the liquid crystal polymer, the fibers can be better avoided from melting or bonding. As heating is carried out in vacuum, the liquid crystal polymer can be better avoided from thermal oxidative aging at high temperature.

In one or more embodiments, after heat treatment, the fibers in the above step (1) is rewound on a paper tube again, which is beneficial to storage, transportation and subsequent stable addition into the polymer.

In one or more embodiments, after the heat treatment, the fibers are rewound. During the rewinding, the fibers are further stretched, wherein a stretching ratio ranges from 1.05 times to 2 times.

In one or more embodiments, the winding process is carried out at a temperature ranging from 200° C. to 360° C., which is beneficial for further crystallization of the fibers.

In one or more embodiments, a diameter of the fibers in step (1) ranges from 0.1 μm to 30 μm; in one or more embodiments, the diameter of the fibers in step (1) ranges from 0.1 μm to 25 μm; and in one or more embodiments, the diameter of the fibers in step (1) ranges from 1 μm to 10 μm.

In one or more embodiments, a typical but not-limiting diameter of the fibers prepared in step (1) is, for example, 0.1 μm, 1 μm, 2 μm, 3 μm, 4 μm, 5 μm, 6 μm, 7 μm, 8 μm, 9 μm, 10 μm, 15 μm or 25 μm.

In one or more embodiments, a strength of the fibers in step (1) is greater than 50 cN/dtex, and a modulus of elasticity of the fibers is greater than 300 cN/dtex; and in one or more embodiments, the strength of the fibers in step (1) ranges from 55 cN/dtex to 100 cN/dtex, and the modulus of elasticity of the fibers ranges from 800 cN/dtex to 1,200 cN/dtex.

In one or more embodiments, an elongation percentage of the fibers in step (1) ranges from 0.5% to 2%; and in one or more embodiments, the elongation percentage of the fibers in step (1) ranges from 0.8% to 2%.

In one or more embodiments, the process of weaving the fibers into the cloth in step (2) can be realized by hand weaving, non-woven fabric technology, modern three-dimensional weaving technology and modern electrostatic nano-netting technology.

At least two pieces of fibers are doubled, twisted and warped in sequence to form warped yarns, thus making a preliminary preparation for forming a driving shaft. The warp yarns and weft yarns processed in the preliminary preparation are arranged on a loom and interwoven into liquid crystal polymer cloth.

In one or more embodiments, the warp yarns and the weft yarns are interwoven one above the other.

In one or more embodiments, the warp yarns and the weft yarns are fibers made of two different liquid crystal polymers respectively.

In one or more embodiments, a thickness of the liquid crystal polymer cloth in step (2) ranges from 10 μm to 500 μm; and in one or more embodiments, the thickness of the liquid crystal polymer cloth in step (2) ranges from 30 μm to 100 μm.

In one or more embodiments, a typical but not-limiting thickness of the liquid crystal polymer cloth prepared in step (2) is, for example, 10 μm, 30 μm, 40 μm, 50 μm, 60 μm, 70 μm, 80 μm, 90 μm, 100 μm, 200 μm, 300 μm, 400 μm or 500 μm.

In one or more embodiments, the weaving method in step (2) is a conventional method in the art, which comprises: doubling, twisting and warping the fibers prepared in step (1) in sequence to form warped yarns, which may be used as warp yarns or weft yarns; and then interweaving the warp yarns and the weft yarns with each other to form the liquid crystal polymer cloth.

In one or more embodiments, the warp yarns and the weft yarns are vertically interwoven with each other.

In one or more embodiments, in step (3), a calender is used for continuous pressing or a laminator is used for pressing, and the liquid crystal polymer cloth prepared in step (2) needs to be preheated before pressing. For pressing, a desired thickness can be achieved by multiple pressing.

In one or more embodiments, in step (3), the pressing is carried out at a pressure of 15 MPa to 50 MPa and lasts for 50 seconds to 350 seconds; and in one or more embodiments, in step (3), the pressing is carried out at a pressure of 20 MPa to 40 MPa and lasts for 60 seconds to 300 seconds.

In one or more embodiments, in step (3), the obatined liquid crystal polymer film is kept at 200° C. to 400° C. for 0.1 hour to 36 hours under the protection of vacuum or inert gas so as to improve the mechanical strength of the liquid crystal polymer film.

In one or more embodiments, the stretching in step (3) is carried out under the protection of inert gas, at a temperature of 250° C. to 350° C. under a traction force of 5 N to 50 N, and the same traction force is applied in the transverse direction and the longitudinal direction. According to the preparing method of the present disclosure, a film can be obtained in which either the transverse tensile strength (L1) or the longitudinal tensile strength (L2) can reach 100 MPa or more. According to the preparing method of the present disclosure, a film with a tensile strength ratio of L1 and L2 (L1/L2) of 0.8 to 1.2 can be obtained.

In one or more embodiments, a thickness of the liquid crystal polymer film in step (3) ranges from 20 μm to 90 μm; and in one or more embodiments, the thickness of the liquid crystal polymer film in step (3) ranges from 25 μm to 75 μm.

In one or more embodiments, a typical but not-limiting thickness of the liquid crystal polymer film prepared in step (3) is, for example, 20 μm, 25 μm, 30 μm, 35 μm, 40 μm, 45 μm, 50 μm, 55 μm, 60 μm, 65 μm, 70 μm, 75 μm, 80 μm or 90 μm.

The present disclosure also provides a liquid crystal polymer film, wherein the liquid crystal polymer film is prepared by the method for preparing the liquid crystal polymer film mentioned above.

The liquid crystal polymer film of the present disclosure is applied to the field of semiconductors.

The present disclosure also provides use of the above-mentioned liquid crystal polymer film in the field of semiconductors.

The present disclosure also provides a circuit board (e.g., a flexible printed circuit board, i.e., FPC) comprising a metallic foil and the liquid crystal polymer film of the present disclosure.

In one or more embodiments, the metallic foil is at least one selected form the group consisting of copper foil, aluminum foil, gold foil, nickel foil or silver foil.

In one or more embodiments, the copper foil is a rolled copper foil or an electrolytic copper foil with a thickness ranging from 9 μm to 70 μm.

In one or more embodiments, the thickness of the metallic foil ranges from 9 μm to 70 μm.

The present disclosure also provides a method for preparing a circuit board (e.g., a flexible printed circuit board, i.e., FPC), comprising the following step of:

laminating the metallic foil with the liquid crystal polymer film of the present disclosure at a temperature of 200° C. to 400° C. and a pressure of 1 MPa to 100 MPa for 10 seconds to 600 seconds.

In one or more embodiments, a surface of at least one side (the side in contact with the metallic foil) of the liquid crystal polymer film is subjected to physical grinding or uviolizing to form a roughened surface, so as to improve a peel strength between the liquid crystal polymer film and the metallic foil.

A structure between the liquid crystal polymer film and the metallic foil may be a two-layer structure formed by the liquid crystal polymer film and the metallic foil, a three-layer structure formed by laminating the metallic foil on both sides of the liquid crystal polymer film, and a five-layer structure formed by alternately laminating the liquid crystal polymer film and the metallic foil.

In one or more embodiments, the prepared FPC has a thickness ranging from 10 μm to 500 μm, a dielectric constant less than 3.5, a dielectric loss tangent angle less than 0.01, and a peel strength greater than 0.8 N/mm.

Compared with the prior art, the present disclosure has the following beneficial effects:

(1) The liquid crystal polymer film prepared by the method of the present disclosure is good in mechanical property, and has a tensile strength that can exceed 170 MPa. The liquid crystal polymer film according to the present disclosure is applied to a FPC, which makes the FPC have a dielectric constant less than 3 and a small dielectric loss tangent angle.

(2) The method for preparing the liquid crystal polymer film according to the present disclosure is simple, without using a large number of organic solvents, which is environmental-friendly and is suitable for industrial mass production.

DETAILED DESCRIPTION

In order to make those skilled in the art better understand the technical solutions of the present disclosure, the following embodiments are now provided for description. It should be understood that the following embodiments do not limit the scope of protection claimed by the present disclosure. If the specific conditions are not indicated in the embodiments, the conventional conditions or the conditions suggested by the manufacturer should be followed. If the manufacturer of the reagent or the instrument used is not indicated, the reagent or the instrument is regarded as a commercially available conventional product.

Embodiment 1

Preparation of Liquid Crystal Polymer (A1).

1,027.5 g of 4-hydroxybenzoic acid (HBA), 470 g of 6-hydroxy-2-naphthoic acid (HNA), 1,122 g of acetic anhydride, and 200.0 g of acetic acid were added into a reactor equipped with a stainless steel C-type stirrer, a torque meter, a nitrogen conduit, a thermometer, a pressure meter and a reflux condenser. The reactor was purified by vacuumizing and flushing with dry nitrogen, then 0.3 g of 1-methylimidazole was added, stirred at a speed of 150 rpm under the protection of nitrogen, heated to 150° C. within 60 minutes, and refluxed at the temperature for 60 minutes. After 13.0 g of phenol was added into the reactor, the reactor was heated to 340° C. within 120 minutes. During this period, the by-product acetic acid was removed by distillation. After keeping at a constant temperature of 340° C. for 30 minutes, the pressure was gradually reduced to about 100 Pa within 15 minutes and a vacuum condition was kept until the torque was increased by more than 30%. After finishing the reaction, a prepolymer was taken out, and cooled to room temperature, and then crushed by a crusher. Solid-phase polymerization was carried out on the crushed prepolymer by the following method comprising: under a negative pressure of 200 Pa, heating the crushed prepolymer from room temperature to 230° C. within 3 hours, then heating the crushed prepolymer from 230° C. to 265° C. within 3 hours, and keeping the temperature at 265° C. for 10 hours to obtain the liquid crystal polymer (A1).

After testing, it was found that the liquid crystal polymer (A1) had a melting point of 300° C., an intrinsic viscosity of 5.5 dL/g, a dielectric constant (Dk) of 2.9, and a dielectric loss tangent angle (Df) of 0.0012.

Embodiment 2

Preparation of Liquid Crystal Polymer (A2).

994.5 g of p-hydroxybenzoic acid, 299.0 g of terephthalic acid, 99.7 g of isophthalic acid, 446.9 g of 4,4'-dihydroxybiphenol, 1,347.6 g of acetic anhydride and 200.0 g of acetic acid were added into a reactor equipped with a stainless steel C-type stirrer, a torque meter, a nitrogen conduit, a thermometer, a pressure meter and a reflux condenser. The reactor was purified by vacuumizing and flushing with dry nitrogen, then 0.18 g of 1-methylimidazole was added, stirred at a speed of 75 rpm under the protection of nitrogen, heated to 150° C. within 60 minutes, and refluxed at the temperature for 60 minutes. After 13.0 g of benzylamine and 1.84 g of calcium acetate were added into the reactor, the reactor was heated to 340° C. within 20 minutes. During this period, the by-product acetic acid was removed by distillation. After keeping at a constant temperature of 340° C. for 30 minutes, the pressure was gradually reduced to about 100 Pa within 20 minutes and a vacuum condition was kept until the torque was increased by more than 30%. After finishing the reaction, a prepolymer was taken out, cooled to room temperature, and then crushed by a crusher. Solid-phase polymerization was carried out on the crushed prepolymer by the following method comprising: under an atmosphere of nitrogen, heating the crushed prepolymer from room temperature to 250° C. within 3 hours, then heating the crushed prepolymer from 250° C. to 295° C. within 5 hours, and keeping the temperature at 295° C. for 2.5 hours to obtain the liquid crystal polymer (A2).

After testing, it was found that the liquid crystal polymer (A2) had a melting point of 335° C., an intrinsic viscosity of 7 dL/g, a dielectric constant (Dk) of 3.1, and a dielectric loss tangent angle (Df) of 0.0012.

Embodiment 3: Preparation of Liquid Crystal Polymer Film

The liquid crystal polymer (A1) prepared in Embodiment 1 was dried in a vacuum dryer at 150° C. for 12 hours, melt-extruded by a double-screw extruder after the moisture content was lower than 10 ppm, and metered by a gear pump. The liquid crystal polymer (A1) was supplied to a spinning package. In this case, the spinning temperature from the outlet of the extruder to the spinning package was 330° C. The filtering mesh of the filter was 300 meshes, the liquid crystal polymer (A1) was sprayed at a spraying rate of 18 cc/min by a spinning nozzle having 58 orifices with an aperture of 0.15 mm, and 58 monofilaments were wound on an aluminum alloy winding drum (with a thermal expansion coefficient of $2.5*10^{-5}$) at a speed of 900 m/min at the same time, and then, under a negative pressure of 100 Pa, heated from room temperature to 240° C. within 5 hours, then heated from 240° C. to 270° C. within 2 hours, and insulated at 270° C. for 18 hours for heat treatment. After heat treatment, the monofilaments were stretched at a speed of 400 m/min according to a stretching ratio of 1:1.2 (a stretching ratio of the transverse direction to the longitudinal direction of the film), and rewound from the heat treatment winding drum to the paper tube at 265° C. to obtain a fiber (F1). After testing, it was found that the fiber had a diameter of 9 μm, a strength of 55 cN/dtex, an elongation percentage of 1.87%, and a modulus of elasticity of 950 cN/dtex.

Two pieces of fibers (F1) were doubled, twisted and warped in sequence to form warped yarns, and the warped yarns were vertically interwoven with weft yarns to form cloth (B1). The cloth (B1) had a thickness of 32 μm.

First, the cloth (B1) was heated to 260° C. by hot blast reflow soldering, and then pressed for 60 seconds at 275° C. by a laminator with a pressure of 35 MPa to obtain a film. Then, the obtained film was heat-treated at 260° C. under the protection of nitrogen for 1 hour, and at the same time, a traction force of 10 N was applied in both transverse and longitudinal directions of the obtained film to obtain the liquid crystal polymer film.

After testing, it was found that a transverse tensile strength of the liquid crystal polymer film was 150 MPa, a relative deviation of the tensile strength was 6%, a ratio of the transverse tensile strength to the longitudinal tensile strength was 0.95, a thickness of the liquid crystal polymer film was 25 μm, and a relative deviation of the thickness of the film was 5%.

Embodiment 4: Preparation of Liquid Crystal Polymer Film

The liquid crystal polymer (A1) prepared in Embodiment 1 was dried in a vacuum dryer at 150° C. for 12 hours, melt-extruded by a double-screw extruder after the moisture content was lower than 10 ppm, metered by a gear pump. The liquid crystal polymer (A1) was supplied to a spinning package. In this case, the spinning temperature from the outlet of the extruder to the spinning package was 330° C. The filtering mesh of the filter was 300 meshes, the liquid crystal polymer (A1) was sprayed at a spraying rate of 18 cc/min by a spinning nozzle having 58 orifices with an aperture of 0.15 mm, and 58 monofilaments were wound on an aluminum alloy winding drum (with a thermal expansion coefficient of $2.5*10^{-5}$) at a speed of 900 m/min at the same time, and then, under a negative pressure of 100 Pa, heated from room temperature to 240° C. within 5 hours, then heated from 240° C. to 270° C. within 2 hours, and insulated at 270° C. for 18 hours for heat treatment. After heat treatment, the monofilaments were stretched at a speed of 400 m/min according to a stretching ratio of 1:1.2, and rewound from the heat treatment winding drum to the paper tube at 265° C. to obtain a fiber (F1). After testing, it was found that the fiber had a diameter of 9 μm, a strength of 55 cN/dtex, an elongation percentage of 1.87%, and a modulus of elasticity of 950 cN/dtex.

Five pieces of fibers (F1) were doubled, twisted and warped in sequence to form warped yarns, and the warp yarns were vertically interwoven with weft yarns to form cloth (B2). The cloth (B2) had a thickness of 80 μm.

First, the cloth (B2) was heated to 260° C. by hot blast reflow soldering, and then pressed for 120 seconds at 275° C. by a laminator with a pressure of 40 MPa to obtain a film. Then, the obtained film was heat-treated at 260° C. under the protection of nitrogen for 5 hours, and at the same time, a traction force of 30 N was applied in both transverse and longitudinal directions of the obtained film to obtain the liquid crystal polymer film.

After testing, it was found that a tensile strength of the liquid crystal polymer film was 145 MPa, a relative deviation of the tensile strength was 5%, a ratio of the transverse tensile strength to the longitudinal tensile strength was 1.03, a thickness of the film was 50 μm, and a relative deviation of the thickness of the film was 4%.

Embodiment 5: Preparation of Liquid Crystal Polymer Film

The liquid crystal polymer (A2) prepared in Embodiment 2 was dried in a vacuum dryer at 150° C. for 12 hours, melt-extruded by a double-screw extruder after the moisture content was lower than 10 ppm, and metered by a gear pump. The liquid crystal polymer (A2) was supplied to a spinning package. In this case, the spinning temperature from the outlet of the extruder to the spinning package was 360° C. The filtering mesh of the filter was 300 meshes, the liquid crystal polymer (A2) was sprayed at a spraying rate of 18 cc/min by a spinning nozzle having 58 orifices with an aperture of 0.2 mm, and 58 monofilaments were wound on an aluminum alloy winding drum (with a thermal expansion coefficient of $2.5*10^{-5}$) at a speed of 600 m/min at the same time, and then, under a negative pressure of 100 Pa, heated from room temperature to 280° C. within 6 hours, then heated from 280° C. to 310° C. within 4 hours, and insulated at 310° C. for 10 hours for heat treatment. After heat treatment, the monofilaments were stretched at a speed of 400 m/min according to a stretching ratio of 1:1.1 (a stretching ratio of the transverse direction to the longitudinal direction of the film), and rewound from the heat treatment winding drum to the paper tube at 285° C. to obtain a fiber (F2). After testing, it was found that the fiber (F2) had a diameter of 10 μm, a strength of 64 cN/dtex, an elongation percentage of 0.87%, and a modulus of elasticity of 1,020 cN/dtex.

Two pieces of fibers (F2) were doubled, twisted and warped in sequence to form warped yarns, and the warped yarns were vertically interwoven with weft yarns to form cloth (B3). The cloth (B3) had a thickness of 35 μm.

First, the cloth (B3) was heated to 280° C. by hot blast reflow soldering, and then pressed for 90 seconds at 315° C. by a laminator with a pressure of 20 MPa to obtain a film. Then, the obtained film was heat-treated at 315° C. under the protection of nitrogen for 3 hours, and at the same time, a traction force of 15 N was applied in both transverse and longitudinal directions of the obtained film to obtain the liquid crystal polymer film.

After testing, it was found that a tensile strength of the liquid crystal polymer film was 165 MPa, a relative deviation of the tensile strength was 4%, a ratio of the transverse tensile strength to the longitudinal tensile strength was 0.89, a thickness of the film was 30 μm, and a relative deviation of the thickness of the film was 3%.

Embodiment 6: Preparation of Liquid Crystal Polymer Film

The liquid crystal polymer (A2) prepared in Embodiment 2 was dried in a vacuum dryer at 150° C. for 12 hours, melt-extruded by a double-screw extruder after the moisture content was lower than 10 ppm, and metered by a gear pump. The liquid crystal polymer (A2) was supplied to a spinning package. In this case, the spinning temperature from the outlet of the extruder to the spinning package was 360° C. The filtering mesh of the filter was 300 meshes, the liquid crystal polymer (A2) was sprayed at a spraying rate of 18 cc/min by a spinning nozzle having 58 orifices with an aperture of 0.2 mm, and 58 monofilaments were wound on an aluminum alloy winding drum (with a thermal expansion coefficient of $2.5*10^{-5}$) at a speed of 600 m/min at the same time, and then, under a negative pressure of 100 Pa, heated from room temperature to 280° C. within 6 hours, then heated from 280° C. to 310° C. within 4 hours, and insulated at 310° C. for 10 hours for heat treatment. After heat treatment, the monofilaments were stretched at a speed of 400 m/min according to a stretching ratio of 1:1.1 (a stretching ratio of the transverse direction to the longitudinal direction of the film), and rewound from the heat treatment winding drum to the paper tube at 285° C. to obtain a fiber (F2). After testing, it was found that the fiber (F2) had a diameter of 10 μm, a strength of 64 cN/dtex, an elongation percentage of 0.87%, and a modulus of elasticity of 1,020 cN/dtex.

Five pieces of fibers (F2) were doubled, twisted and warped in sequence to form warped yarns, and the warped yarns were vertically interwoven with weft yarns to form cloth (B4). The cloth (B4) had a thickness of 90 μm.

First, the cloth (B4) was heated to 280° C. by hot blast reflow soldering, and then pressed for 180 seconds at 315° C. by a laminator with a pressure of 40 MPa to obtain a film. Then, the obtained film was heat-treated at 315° C. under the protection of nitrogen for 10 hours, and at the same time, a traction force of 40 N was applied in both transverse and longitudinal directions of the obtained film to obtain the liquid crystal polymer film.

After testing, it was found that a tensile strength of the liquid crystal polymer film was 155 MPa, a relative deviation of the tensile strength was 6%, a ratio of the transverse tensile strength to the longitudinal tensile strength was 0.97, a thickness of the film was 75 μm, and a relative deviation of the thickness of the film was 4%.

Embodiment 7: Preparation of Liquid Crystal Polymer Film

Five pieces of the fibers (F1) above were doubled, twisted and warped in sequence to form warped yarns which were used as warp yarns; five pieces of fibers (F2) were doubled, twisted and warped in sequence to form warped yarns which were used as weft yarns; and the warped yarns were vertically interwoven with the weft yarns to form cloth (B5). The cloth (B5) had a thickness of 85 μm.

First, the cloth (B5) was heated to 260° C. by hot blast reflow soldering, and then pressed for 300 seconds at 275° C. by a laminator with a pressure of 40 MPa to obtain a film. Then, the obtained film was heat-treated at 260° C. under the protection of nitrogen for 8 hours, and at the same time, a traction force of 30 N was applied in both transverse and longitudinal directions of the obtained film to obtain the liquid crystal polymer film.

After testing, it was found that a tensile strength of the liquid crystal polymer film was 175 MPa, a relative deviation of the tensile strength was 3%, a ratio of the transverse tensile strength to the longitudinal tensile strength was 1.12, a thickness of the film was 75 μm, and a relative deviation of the thickness of the film was 2%.

Embodiment 8: Preparation of Liquid Crystal Polymer Film

A method for preparing a liquid crystal polymer film, comprised the following steps of:

spinning the liquid crystal polymer (A1) prepared in Embodiment 1 into fibers with a diameter of 20 μm by a melt spinning method (conventional spinning method), and then keeping the fibers at 380° C. for 10 hours under a vacuum degree of 400 Pa for later use;

weaving two pieces of fibers prepared in step (1) into cloth with a thickness of 40 μm by a conventional non-woven technology for later use; and pressing the cloth prepared in step (2) into a film at 300° C. with a pressure of 30 MPa for 250 seconds, then stretching the film at 260° C. under the protection of inert gas with a traction force of 20 N, and then keeping the temperature at 260° C. for 5 hours under the protection of inert gas to obtain the liquid crystal polymer film.

After testing, it was found that a tensile strength of the crystal polymer film was 170 MPa, a relative deviation of the tensile strength was 3%, a ratio of the transverse tensile strength to the longitudinal tensile strength was 0.90, a thickness of the film was 60 μm, and a relative deviation of the thickness of the film was 2.5%.

Comparative Embodiment 1

The liquid crystal polymer (A1) was heated and melted by using a uniaxial extruder with a cylinder temperature of 300° C. The obtained melt was extruded from an annular die with a diameter of 40 mm and a gap spacing of 0.5 mm at a die head temperature of 275° C. and a shearing rate of 900 seconds$^{-1}$, expanded at a blow ratio of 4.7 and a draw ratio of 2.1, cooled, and then pulled out by a pinch roll to obtain a liquid crystal polymer film with a thickness of 50 μm.

After testing, it was found that a tensile strength of the crystal polymer film was 81 MPa, and a relative deviation of the thickness of the liquid crystal polymer film was 21%.

Comparative Embodiment 2

8 g of the above liquid crystal polymer (A2) powder and 0.08 g of phenyl acetate were added to 92 g of p-chlorophenol, and heated to 120° C. to obtain a mixed solution. The mixed solution was coated on a surface of a copper foil, evaporated at 100° C. for 1 hour to remove the p-chlorophenol, and then subjected to heat treatment under a nitrogen atmosphere and at 280° C. for 60 minutes by a hot air dryer to obtain the liquid crystal polymer film with the copper foil. The liquid crystal polymer film with copper foil was immersed in a ferric chloride solution to remove the copper foil to obtain the liquid crystal polymer film.

After testing, it was found that a tensile strength of the crystal polymer film was 55 MPa, a thickness of the liquid crystal polymer film was 25 μm, and a relative deviation of the thickness of the film was 11%.

A method for testing the tensile strength of the liquid crystal polymer film was as follows:

The obtained liquid crystal polymer film was divided into 10 equal parts in transverse or longitudinal directions, so that 10 test pieces with a width of 1 cm and a length of 15 cm were cut out. Each test piece was stretched with a universal testing machine at a speed of 10 mm/min at room temperature with a fixture spacing of 10 cm, and the tensile strength was measured according to the method of ISO527. The arithmetic mean of 10 measured values was regarded as the testing value of the tensile strength.

A method for testing the thickness of the liquid crystal polymer film was as follows:

A digital thickness gauge (model GY-120) was used to measure the thickness of the film at a spacing of 1 cm in the transverse direction and recorde10 data. The arithmetic mean of the measured values obtained was regarded as the testing value of the thickness of the liquid crystal polymer film. Relative deviation=$(\sigma/\overline{X})*100\%$, $\overline{X}$ referred to an arithmetic mean, and $\sigma$ referred to a range.

Test conditions of dielectric constant (Dk) and dielectric loss tangent angle (Df) were as follows: an instrument Agilent N5230A and a fixture SPDR were used, and the measurement frequency was 10 GHz.

Application Example: Preparation of FPC

A copper foil and the liquid crystal polymer film prepared in Embodiment 3 were laminated at a temperature of 270° C. and a pressure of 20 MPa for 30 seconds to prepare the FPC with a thickness of 40 μm.

After testing, it was found that a dielectric constant (Dk) of the FPC was 2.9, a dielectric loss tangent angle (Df) of the FPC was 0.006, and a peel strength of the FPC was 1.3 N/mm.

Test conditions of the peel strength were as follows: the testing was carried out according to the method of IPC-TM-650 2.4.9, and the peel strength of the metal layer at 90 degrees was tested. The recorded data recorded was a value of the smaller peel strength in both sides of a double-sided laminate.

INDUSTRIAL APPLICABILITY (1) The liquid crystal polymer film prepared by the method of the present disclosure is good in mechanical property, and has a tensile strength that can exceed 170 MPa. The liquid crystal polymer film according to the present disclosure is applied to a FPC, which makes the FPC have a dielectric constant less than 3 and a small dielectric loss tangent angle.

(2) The method for preparing the liquid crystal polymer film according to the present disclosure is simple, without using a large number of organic solvents, which is environmental-friendly and is suitable for industrial mass production.

The invention claimed is:

1. A method for preparing a liquid crystal polymer film, comprising:
   (1) spinning a liquid crystal polymer into fibers, and maintaining the fibers for 0.1 hour to 36 hours at a temperature of 200° C. to 400° C. under a vacuum degree less than 500 Pa for later use;
   (2) weaving the fibers prepared in step (1) into cloth for later use; and
   (3) pressing the cloth prepared in step (2) into a film at a temperature of 200° C. to 400° C., and then stretching the film to obtain the liquid crystal polymer film.

2. The method according to claim 1, wherein the liquid crystal polymer has a dielectric constant less than 3.5 and a dielectric loss tangent angle less than 0.002.

3. The method according to claim 1, wherein the liquid crystal polymer has a melting point greater than 280° C.

4. The method according to claim 1, wherein the liquid crystal polymer has an intrinsic viscosity ranging from 4 dL/g to 10 dL/g.

5. The method according to claim 1, wherein in step (1), the liquid crystal polymer is spun into fibers by using a melt spinning method; and a diameter of a spinning nozzle used in the melt spinning method is less than 0.5 mm.

6. The method according to claim 5, wherein devices used in the melt spinning method comprise a double-screw extruder, a melt pump, a filter, the spinning nozzle and a winder.

7. The method according to claim 6, wherein a filtering mesh of the filter ranges from 60 meshes to 500 meshes.

8. The method according to claim 6, wherein the winder has a winding speed ranging from 300 m/min to 2,000 m/min.

9. The method according to claim 5, wherein a thermal expansion coefficient of a winding drum is larger than a thermal expansion coefficient of the fibers by 10% to 800%.

10. The method according to claim 1, wherein a diameter of the fibers in step (1) ranges from 0.1 μm to 30 μm.

11. The method according to claim 1, wherein a strength of the fibers in step (1) is greater than 50 cN/dtex.

12. The method according to claim 1, wherein an elongation percentage of the fibers in step (1) ranges from 0.5% to 2%.

13. The method according to claim 1, wherein a thickness of the cloth in step (2) ranges from 100 μm to 500 μm.

14. The method according to claim 1, wherein in step (3), the pressing is carried out at a pressure of 15 MPa to 50 MPa and lasts for 50 seconds to 350 seconds.

15. The method according to claim 1, wherein in step (3), the obtained liquid crystal polymer film is kept at 200° C. to 400° C. for 0.1 hour to 36 hours under the protection of vacuum or inert gas.

\* \* \* \* \*